AFC CIRCUIT ARRANGEMENT FOR FINE-TUNING THE SINE-OSCILLATING CIRCUIT OF A HORIZONTAL OSCILLATOR IN TELEVISION SETS
Filed March 30, 1964

INVENTOR
GERHARD-GÜNTER GASSMANN

BY Philip M. Bolton
ATTORNEY

United States Patent Office 3,370,123
Patented Feb. 20, 1968

3,370,123
AFC CIRCUIT ARRANGEMENT FOR FINE-TUNING THE SINE-OSCILLATING CIRCUIT OF A HORIZONTAL OSCILLATOR IN TELEVISION SETS

Gerhard-Günter Gassmann, Berkheim, Wurttemberg, Germany, assignor to International Standard Electric Corporation, New York, N.Y., a corporation of Delaware
Filed Mar. 30, 1964, Ser. No. 355,698
Claims priority, application Germany, Apr. 9, 1963, St 20,487
2 Claims. (Cl. 178—7.3)

ABSTRACT OF THE DISCLOSURE

A reactance diode is used for fine-tuning of an oscillator in an automatic phase and frequency television synchronization circuit. A silicon diode is operated in the cut-off range to provide high impedance capacitive connection between the oscillator and the base of a transistor reactance stage to phase shift the current in accordance with a control voltage.

The invention relates to a circuit arrangement for fine-tuning of the sine-oscillating circuit of a horizontal oscillator in television sets, in which the sine-oscillating circuit is precision-tuned through a transistor reactance stage by means of a fine-tuning control voltage.

In tube-equipped TV sets, a so-called phase- and frequency-comparing circuit is frequently used for fully automatic horizontal synchronization. Such a circuit produces in the synchronized condition, a control voltage which depends on the phase deviation between the oscillator voltage and the synchronizing voltage. In the asynchronized condition it, furthermore, produces a control voltage which depends on the frequency difference of both signals. These phase- and frequency-comparing circuits are relatively high-ohmic in general, their output resistance is e.g. approximately 1.5 to 2.0 megohms.

In order to use such a circuit in transistorized or partly transistorized equipment two series connected impedance converters were required in order to operate a reactance stage through this high-ohmic control voltage.

The object of the invention is to avoid the considerable expenditure of this known circuit arrangement. The invention provides a circuit arrangement for fine-tuning of the sine-oscillating circuit of a horizontal oscillator in television sets through a transistor reactance stage by means of a fine-tuning control voltage. The fine-tuning control voltage is led to a reactance diode which is inserted into the network for phase-shifting of the operating current in the transistor reactance stage.

One kind of reactance diode is, for example, a silicon diode, operated within the cut-off range. A reactance diode alone is not able to fine-tune the relatively low-ohmic oscillating circuit of a horizontal oscillator. It is therefore proposed to connect such a silicon diode with a reactance circuit in such a way that the fine-tuning diode within a network is used for phase shifting the base current of the reactance stage. In this manner the fine-tuning effect of the reactance diode can considerably be enlarged, e.g. by eighty times.

The invention is now in detail explained with the aid of the accompanying drawings.

Figure 1:
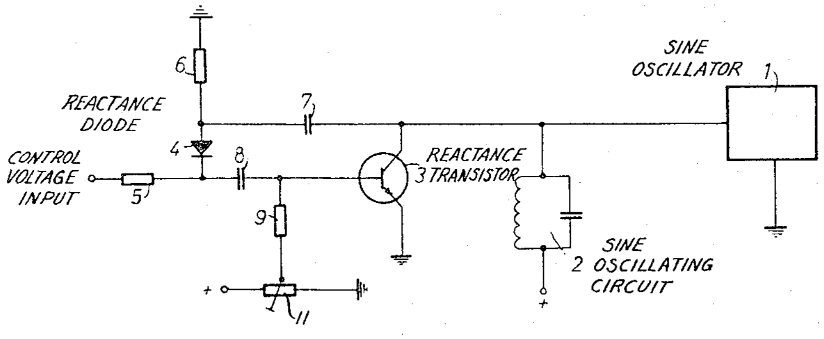

FIG. 1 shows a circuit arrangement according to the invention. In this figure the sine-oscillator is indicated with 1, the sine-oscillating circuit with 2, the reactance stage with 3 and the reactance diode with 4. The control voltage is led to said reactance diode via the resistor 5. The other end of the reactance diode is grounded via resistor 6. The sine-voltage of the oscillating circuit 2 is led to the reactance diode via the coupling capacitor 7. The other end of the reactance diode is connected with the base of the transistor reactance stage via the coupling capacitor 8. The capacity of diode 4 causes a phase shift of the circular-sine-voltage by approximately 90°, in conjunction with the base input resistance of the reactance stage. The leakage resistor 9 is thereby in parallel with the base input resistance so that its magnitude is also determinative of the base-sine-voltage. The reactance stage receives a fixed bias at the base of transistor 3 via resistors 9 and 11. Of course, it is possible here, too, as frequently used in transistor stages, to provide a relatively large bias in order to balance transistor tolerances and to stabilize the Q-point by means of a resistance/capacitance element in the emitter circuit.

Figure 2:
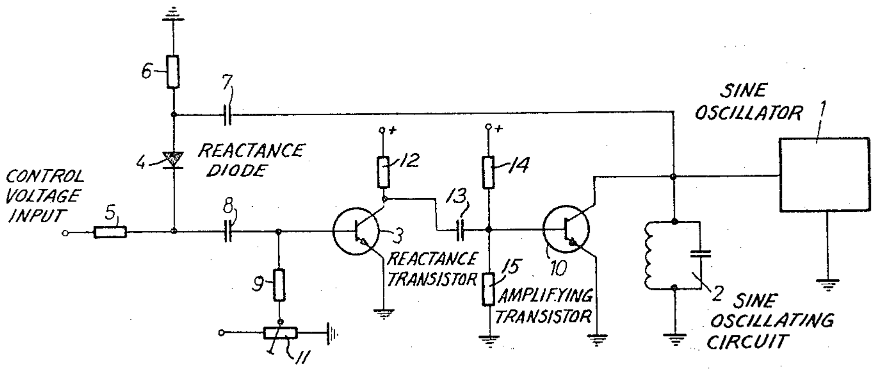

FIG. 2 shows a somewhat modified example of the circuit arrangement according to FIG. 1. For the same components the same references are used as in FIG. 1. For sine-tuning of oscillating circuits with a particularly low impedance, e.g. in self-oscillating line output stages, functioning as sine-oscillators in addition, an additional amplifying stage 10 is provided in the circuit arrangement shown in FIG. 2 for a further amplification of the reactance current. Load resistor 12, coupling capacitor 13 and bias resistors 14, 15 complete the modified arrangement shown.

While I have described above the principles of my invention in connection with specific apparatus, it is to be clearly understood that this description is made only by way of example and not as a limitation to the scope of my invention as set forth in the objects thereof and in the accompanying claims.

What I claim is:

1. A circuit for the fine-tuning of the sine wave oscillating circuit of a horizontal oscillator in television receivers comprising:
- a fine-tuning control voltage source;
- a reactance transistor having its collector coupled to said sine wave oscillating circuit;
- a reactance diode coupled between the sine wave oscillating circuit and base of said transistor by first and second coupling capacitors;
- a first resistor coupling the junction between said first coupling capacitor and said diode to ground;
- a second resistor coupling the junction between said second coupling capacitor and said diode to said control voltage source; and
- resistive means coupled to the base of said transistor and providing a fixed bias at the base thereof, whereby the operating current of said transistor is phase shifted in accordance with the control voltage led to said diode.

2. A circuit according to claim 1, further including an amplifying transistor coupled between said reactance transistor and said sine wave oscillating circuit, said amplifying transistor having its base capacitively coupled to the collector of said reactance transistor and its collector directly coupled to said sine oscillating circuit and to said first coupling capacitor, whereby there is provided a further amplification of the operating current.

References Cited

UNITED STATES PATENTS

| | | | |
|---|---|---|---|
| 2,728,049 | 12/1955 | Riddle | 331—180 X |
| 2,888,648 | 5/1959 | Herring | 332—29 X |
| 3,209,278 | 9/1965 | Binkis | 178—69.5 X |

JOHN W. CALDWELL, *Primary Examiner.*

R. L. RICHARDSON, *Assistant Examiner.*